United States Patent [19]

Schwaderer

[11] Patent Number: 4,490,735

[45] Date of Patent: Dec. 25, 1984

[54] MONOLITHIC INPUT STAGE OF AN OPTICAL RECEIVER

[75] Inventor: Bernhard Schwaderer, Weissach i. T., Fed. Rep. of Germany

[73] Assignee: Licentia Patent-Verwaltungs-G.m.b.H., Frankfurt am Main, Fed. Rep. of Germany

[21] Appl. No.: 413,231

[22] Filed: Aug. 31, 1982

[30] Foreign Application Priority Data

Sep. 8, 1981 [DE] Fed. Rep. of Germany ....... 3135462

[51] Int. Cl.$^3$ ............................................. H01L 27/14
[52] U.S. Cl. ..................................... 357/30; 357/41; 357/4; 357/56; 357/58
[58] Field of Search ...................... 357/30 G, 30 I, 30, 357/41, 4, 56, 58

[56] References Cited

FOREIGN PATENT DOCUMENTS

| 0012029 | 6/1980 | European Pat. Off. ........... 357/30 I |
| 3108798 | 9/1982 | Fed. Rep. of Germany ........ 357/41 |
| 0023258 | 2/1982 | Japan .................................... 357/41 |

OTHER PUBLICATIONS

Leheny et al., "Integrated $In_{0.53}Ga_{0.47}As$ p–i–n F.E.T. Photoreceiver", *Electronics Letters*, May 8, 1980, vol. 16, No. 10, pp. 353–355.

R. C. Hooper et al., PIN–FET Hybrid Optical Receivers for Longer Wavelength Optical Communications Systems, *6th European Conference on Optical Communication*, York, 1980, pp. 222–225.

D. R. Smith, et al., Receivers for Optical Communications: A Comparison of Avalanche Photodiodes with PIN–FET Hybrids, *Optical and Quantum Electronics*, vol. 10, 1978, pp. 293–300.

Ping-King Tien et al., Integrated Optics: Putting It All Together, *Bell Laboratories Record*, Feb., 1981, pp. 38–45.

H. Morkoc et al., "Schottky Barriers and Ohmic Contacts on n-Type InP Based Compound Semiconductors for Microwave FET's", *IEEE Transactions on Electron Devices*, Jan. 1, 1981, vol. ED-28, No. 1, pp. 1–5.

L. Messick, "$InP/SiO_2$ MIS Structure", *Journal of Applied Physics*, Nov. 1976, vol. 47, No. 11, pp. 4949–4951.

M. Chu et al., "1.33-$\mu$m HgCdTe/CdTe Photodiodes", *Applied Physics Letters*, vol. 37, No. 3, Aug. 1, 1980, pp. 318–320.

C. A. Burres, et al., InGaAsP p–i–n Photodiodes with Low Dark Current and Small Capacitance, *Electronics Letters*, Sep. 27th, 1979, vol. 15, No. 20, pp. 655–657.

*Primary Examiner*—Martin H. Edlow
*Assistant Examiner*—William A. Mintel
*Attorney, Agent, or Firm*—Spencer & Frank

[57] ABSTRACT

The present invention relates to a monolithically designed input stage for an optical receiver, the input stage comprising a PIN (more specifically a PNIN) photodiode and a connected field effect transistor. The photodiode, which includes an absorption zone of GaInAsP for the optical radiation and a pn-junction formed by InP layers, is disposed together with the field effect transistor on a common semi-insulating InP substrate.

10 Claims, 4 Drawing Figures

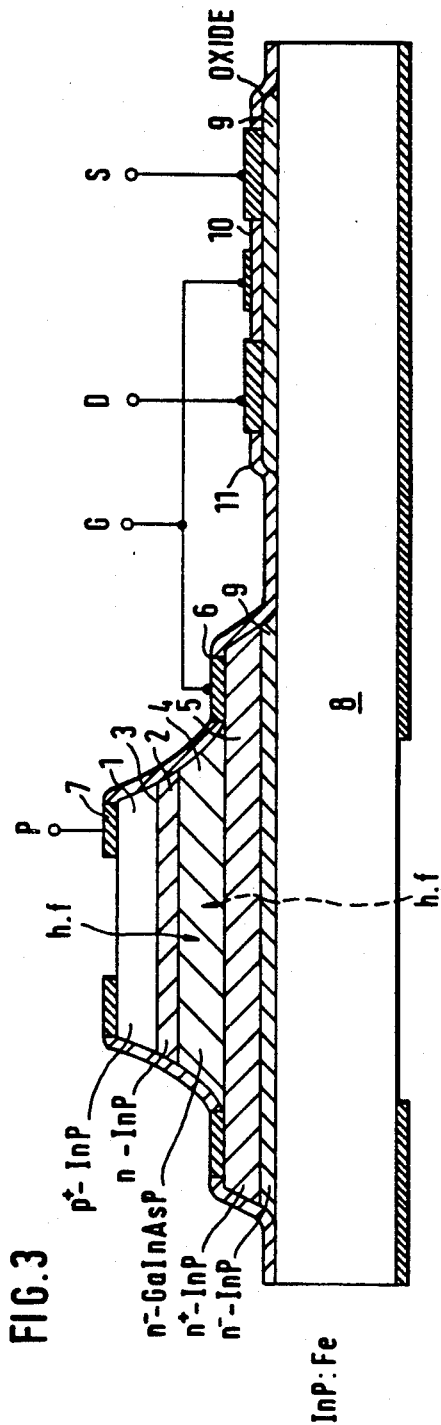

MONOLITHIC INPUT STAGE OF AN OPTICAL RECEIVER

BACKGROUND OF THE INVENTION

The present invention relates to a monolithic input stage for an optical receiver comprising a PNIN photodiode and a field effect transistor connected thereto.

In the past, avalanche photodiodes were usually used in the input stages of broadband optical receivers for fiberoptic transmission systems because of their relatively high sensitivity. The regulation of the avalanche amplification of such photodiodes can be realized only with very complicated circuitry. Moreover, it is necessary to capacitively block the avalanche photodiode against its subsequent amplifier circuit due to the high supply voltage required for the avalanche diode. However, this measure brings about undesirable stray reactances which result in a reduction of the bandwidth of the receiver.

Two publications, D. R. Smith et al, "Receivers for Optical Communications; A Comparison of Avalanche Photodiodes With PIN-FET Hybrids," Optical & Quantum Electronics, Vol. 10, 1978, pages 293–300, and R. C. Hooper et al, "PIN-FET Hybrid Optical Receivers For Longer Wavelength Optical Communication Systems," 6th European Conference on Optical Communications, York, 1980, present proof that it is possible to realize at least as high a receiver sensitivity with a PIN photodiode and a connected field effect transistor (FET) in the input of an optical receiver as with an avalanche photodiode, with the bandwidth being the same. Additionally, PIN photodiodes are voltage compatible with the connected active semiconductor components (bipolar and field effect transistors etc.), i.e., no blocking measures are required which could have a negative effect on the bandwidth of the receivers. Moreover, PIN photodiodes, in contrast to avalanche photodiodes, require no expensive regulating circuit to stabilize the diode blocking voltage.

In order to avoid the use of an avalanche photodiode in an optical receiver but nevertheless realize a high input sensitivity, a number of requirements must be met by the PIN photodiode and the field effect transistor in the input stage. Initially, a very low capacity PIN photodiode with high quantum yield and low dark current must be selected. Moreover, the field effect transistor should have the lowest possible gate leakage current, a large transconductance and a low gate-source capacitance. Finally, care must be taken that reactances which are formed due to the electrical connection between the PIN photodiode and the field effect transistor are kept as low as possible to be able to further raise the limit frequency of the receiver and thus enable its use for the highest bid rates.

SUMMARY OF THE INVENTION

It is the object of the present invention to provide a monolithic input stage which in particular meets the above requirements.

The above object is achieved according to the present invention by providing monolithically integrated input circuits for an optical receiver comprising a PIN, and more specifically a PNIN, photodiode connected to a field effect transistor wherein:

the PNIN photodiode includes a first semiconductor layer of GaInAsP forming an absorption zone for the optical radiation, second and third adjacent semiconductor layers of InP of opposite conductivity types forming a pn junction at their interface, and with the second layer being on one major surface of the first semiconductor layer and with the other major surface of the first semiconductor layer being disposed on one major surface of a carrier. The carrier includes a semi-insulating InP substrate having a layer of weakly doped InP of one conductivity type on one of its major surfaces, with this layer of weakly doped InP forming the above-mentioned one major surface of the carrier and with the carrier being common to both the photodiode and the field effect transistor. Finally, the field effect transistor is formed on a portion of the one surface of the carrier adjacent the photodiode and includes spaced source and drain electrodes contacting the surface of the layer of weakly doped InP, and a gate electrode disposed on the surface of the layer of weakly doped InP between the source and drain electrodes, whereby the layer of weakly doped InP serves as the active zone of the field effect transistor.

According to the preferred embodiment of the invention, the weakly doped InP layer is of $n^-$-conductivity, as is the first semiconductor layer, the second and third semiconductor layers are of n and $p^+$ conductivity, respectively, an $n^+$-InP layer is disposed between the first semiconductor layer and the $n^-$-InP carrier layer to serve as a low resistance contact layer for the PIN photodiode, and the substrate is doped with Fe.

The advantages of the monolithic structure of the receiver input stage according to the invention are now, on the one hand, the low controllable stray reactance, and reproduceability and, on the other hand, the economical production of the circuit.

BRIEF DESCRIPTION OF THE DRAWINGS

FIG. 3 shows the monolithic structure according to the invention of the PNIN photodiode of FIG. 1 and the MES-FET of FIG. 2.

FIG. 4 shows the equivalent circuit for the monolithic structure of FIG. 3.

DETAILED DESCRIPTION OF THE PREFERRED EMBODIMENTS

Figure 1:
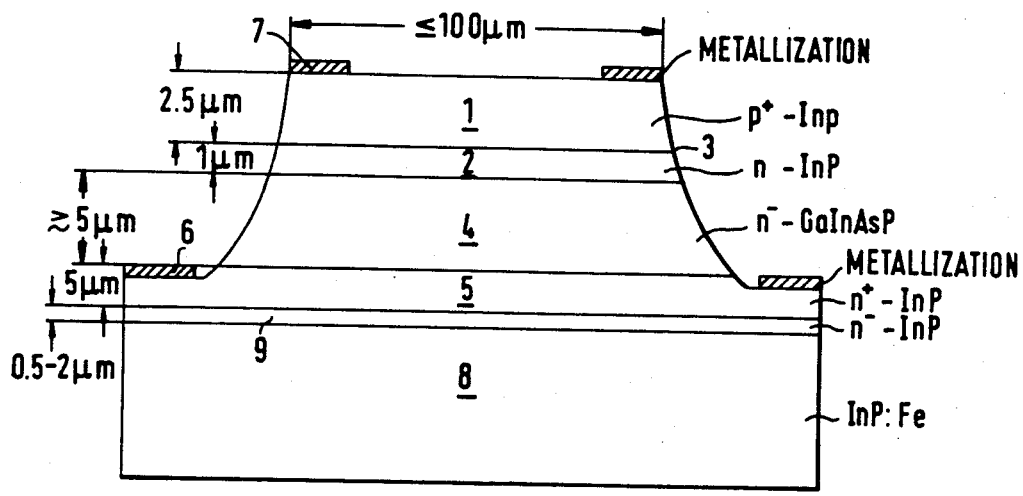
FIG. 1 shows the PNIN photodiode according to the invention.

FIG. 1 shows a PNIN photodiode which is suitable for monolithic design together with a field effect transistor to be described below. As shown, this PNIN photodiode is composed of a plurality of epitaxial layers beginning with the two uppermost opposite conductivity type layers 1 and 2 which form a pn-junction 3 at their interface and comprise $p^+$-InP and n -InP, respectively. This is followed by a layer 4 of $n^-$-GaInAsP, which forms the absorption zone for the optical radiation. The layer 4 is followed by an $n^+$-InP layer 5. The layer 5 serves as the low-resistance contacting zone for the layer 4. To provide a contact for one electrode of the photodiode, the $n^+$-InP layer 5 is provided with a planar region about its periphery to which is applied a metal layer 6. The other electrode for the diode is provided by a metal layer 7 contacting the planar upper major surface of the uppermost $p^+$-InP layer 1. As shown in FIG. 1, the layers 1, 2, 4 and 5 of the PNIN photodiode preferably have thickness of $2.5\mu$, $1\mu$, $\cong 5\mu$, and $5\mu$, respectively.

Due to the fact that the pn-junction 3 is disposed in a zone (p+-InP/n -InP) having a high band spacing, only a low diode dark current develops. Tunnel currents, which are components of the dark current, can therefore be neglected compared to the generation and recombination currents. The dark current for a PNIN diode whose epitaxial layers have the dimensions shown in FIG. 1, lies approximately at 10 nA. The barrier layer capacitance of this diode is approximately 0.5 pF with a diode diameter of about 100μ. This barrier layer capacitance could be even further reduced by reducing the diameter of the diode.

The above-described layer sequence of the PNIN photodiode is applied to a carrier comprising a semi-insulating substrate 8 of Fe doped InP whose upper major surface is covered with a thin (0.5 to 2μ) n−-InP layer 9.

Figure 2:
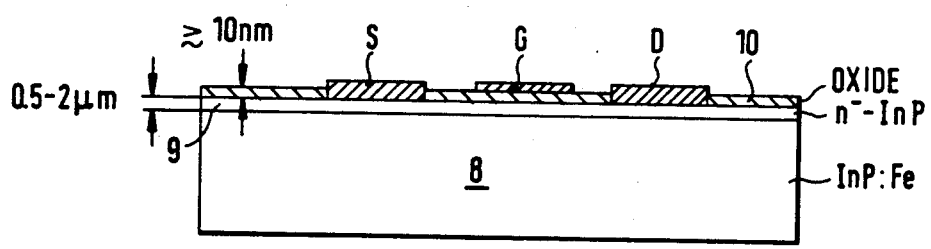
FIG. 2 shows the MES field effect transistor separately by itself.

The metal-semiconductor field effect transistor (MES-FET) as shown in FIG. 2 has the same carrier with the substrate 8 and the n−-InP layer 9 as the PNIN photodiode of FIG. 1. However, as shown in FIG. 2, the n−-InP layer 9 acts as the active zone for the field effect transistor. Disposed on the surface of this active zone or layer 9 are spaced contacts S and D for the source and drain, respectively, while the gate contact G, e.g. of gold, is separated from the surface of the active zone 9 by an oxide layer 10. With an oxide layer 10 of about 10 nm thickness, a high potential barrier (Schottky barrier) will develope between the InP of layer 9 and the Au of gate G at a level of about 0.8 to 0.9 eV.

The monolithic structure of the above-described PNIN photodiode of FIG. 1 and of the MES-FET with thin gate oxide 10 of FIG. 2 is shown in FIG. 3. The exemplarily selected embodiment for the inter-connection of the two elements is shown in the equivalent circuit diagram of FIG. 4. As shown in FIG. 3 the peripheral edges of the mesa-shaped PNIN photodiode as well as any other exposed semiconductor portion on the upper surface of the substrate 8 is covered with an oxide layer 11 which may be the same or a different oxide layer than the layer 10. As further shown in FIG. 3, the MES-FET is constructed on a portion of the upper surface of the carrier 8, 9 to the side of that on which the PNIN photodiode is constructed and the n−-InP layer 9 between the two devices is removed.

When an oxide or insulating layer 10 is used which is thicker than the 10 nm mentioned above, the MES-FET described in connection with FIG. 2 will become an MIS-FET.

Moreover, if the metal gate contact G contacts a flat p doped region in the n−-InP layer 9 instead of contacting the oxide layer 10 as in FIGS. 2 and 3, a barrier layer FET will result.

Since the InP semiconductor material is transparent for the wavelength $\lambda > 1\mu$, the photodiode can be irradiated from the top or from the bottom as indicated in FIG. 3. Irradiation from the bottom permits the realization of very small-area photodiodes with the lowest barrier layer capacitances.

The doping levels of the layers 1, 2, 4, 5 and 9 are $\geq 10^{18} cm^{-3}$, $10^{16}$ to $10^{17} cm^{-3}$, $10^{15}$ to $10^{16} cm^{-3}$, $10^{17}$ to $10^{18} cm^{-3}$ and $10^{16} cm^{-3}$, respectively.

It will be understood that the above description of the present invention is susceptible to various modifications, changes and adaptations, and the same are intended to be comprehended within the meaning and range of equivalents of the appended claims.

What is claimed is:

1. A monolithically integrated input circuit for an optical receiver comprising a PNIN photodiode connected to a field effect transistor and wherein:
   said photodiode includes a first semiconductor layer of n-type GaInAsP forming an absorption zone for the optical radiation, a second and third adjacent semiconductor layers of InP of opposite conductivity types and forming a pn junction at their interface with said second layer being on one major surface of said first layer and with the other major surface of said first layer being disposed on one major surface of a carrier;
   said carrier includes a semi-insulating InP substrate having a layer of weakly doped InP of one conductivity type on one of its major surfaces, with said layer of weakly doped InP forming said one major surface of said carrier and said carrier being common to both said photodiode and said field effect transistor; and
   said field effect transistor is formed on a portion of said one surface of said carrier adjacent said photodiode and includes spaced source and drain electrodes contacting the surface of said layer of weakly doped InP, and a gate electrode disposed on the surface of said layer of weakly doped InP between said source and drain electrodes, whereby said layer of weakly doped InP serves as the active zone of said field effect transistor.

2. An arrangement as defined in claim 1 wherein: said layer of weakly doped InP is of n− conductivity type; and said photodiode further includes a fourth semiconductor layer of InP of low resistivity disposed between said first layer and said layer of weakly doped InP of n− conductivity type, said fourth layer forming a high conductivity contact layer for said photodiode.

3. An arrangement as defined in claim 2 wherein said first, second, third and fourth semiconductors layers of said photodiode and said layer of weakly doped InP are all epitaxial layers; said first layer of GaInAsP is of n− conductivity type, said second and third layers of InP are of n and p+ conductivity, respectively; said fourth layer of InP is of n+ conductivity type; and said semi-insulating substrate of InP is doped with Fe.

4. An arrangement as defined in claim 2 or 3 wherein: said layer of weakly doped InP is 0.5 to 2μ thick; said fourth layer of InP is approximately 5μ thick; said first layer of GaInAsP is $\gtrsim 5\mu$ thick; said second layer of InP is approximately 1μ thick; said third layer of InP is approximately 2.5μ thick; and said photodiode has a diameter of ≦100μ.

5. An arrangement as defined in claim 2 or 3 further comprising a first metal layer contacting a portion of said n+-InP fourth layer of said photodiode to provide one electrode for said photodiode and a further metal layer contacting a portion of said p+-InP third layer to provide the other electrode of said photodiode.

6. An arrangement as defined in claim 5 wherein said first metal layer is connected to said gate electrode of said field effect transistor.

7. An arrangement as defined in claim 2 wherein said field effect transistor is an n−-InP metal-semiconductor field effect transistor (MES-FET).

8. An arrangement as defined in claim 7 where a very thin oxide layer is disposed between said n−-InP layer and said gate electrode of said field effect transistor.

9. An arrangement as defined in claim 2 wherein: said gate electrode is a layer of metal; and an insulating layer is disposed between said n−-InP layer and said gate electrode of said field effect transistor to form a MIS-FET.

10. An arrangement as defined in claim 2 wherein said field effect transistor is a pn-junction InP barrier layer field effect transistor.

* * * * *